United States Patent [19]

Nakamura et al.

[11] Patent Number: 5,616,931
[45] Date of Patent: Apr. 1, 1997

[54] SEMICONDUCTOR DEVICE

[75] Inventors: Toru Nakamura; Keiji Toriyama, both of Tokyo, Japan

[73] Assignee: NEC Corporation, Tokyo, Japan

[21] Appl. No.: 518,690

[22] Filed: Aug. 24, 1995

[30] Foreign Application Priority Data

Aug. 24, 1994 [JP] Japan ................................. 6-222583

[51] Int. Cl.$^6$ ................................. H01L 23/48
[52] U.S. Cl. ........................ 257/48; 257/620; 257/690; 257/786
[58] Field of Search ............................ 257/48, 620, 786, 257/690

[56] References Cited

FOREIGN PATENT DOCUMENTS

| 0031148 | 2/1987 | Japan | 257/620 |
|---|---|---|---|
| 0128636 | 6/1988 | Japan | 257/48 |
| 64-73629 | 3/1989 | Japan . | |
| 0037137 | 2/1994 | Japan | 257/48 |

OTHER PUBLICATIONS

Patent Abstracts of Japan, Section E:E–967, vol. 14, No. 387, p. 158.

Patent Abstracts of Japan, Section E:E–982, vol. 13, No. 292, p. 66.

Patent Abstracts of Japan, Section E:E–199, vol. 7, No. 214, p. 14.

*Primary Examiner*—Sara W. Crane
*Assistant Examiner*—David B. Hardy
*Attorney, Agent, or Firm*—Sughrue, Mion, Zinn, Macpeak & Seas

[57] ABSTRACT

A semiconductor device has a plurality of chip regions each having semiconductor elements disposed therein and a plurality of electrode pads disposed on a surface thereof. The chip regions are separated and defined by scribing line regions. A plurality of dummy pads are disposed in the scribing line regions for use in positioning the electrode pads upon wafer probe test. The dummy pads are disposed in diagonally opposite positions across each of the chip regions one on each side of the each of the chip regions.

6 Claims, 7 Drawing Sheets

SEMICONDUCTOR DEVICE

BACKGROUND OF THE INVENTION

1. Field of the Invention

The present invention relates to a semiconductor device prior to being divided into individual semiconductor chips, the semiconductor device having integrated circuits formed on a semiconductor wafer in a wafer processing step, and more particularly to a semiconductor device which allows bonding pads and a probe card to be positioned easily when integrated circuits on a semiconductor wafer are inspected by a wafer prober.

2. Description of the Related Art

To fabricate semiconductor devices such as ICs (integrated circuits) or the like, a number of ICs or LSI (large-scale-integration) circuits are simultaneously formed on a single semiconductor wafer, and then the semiconductor wafer is divided into a number of IC or LSI chips which contain the ICs or LSI circuits, respectively.

FIG. 1(a) of the accompanying drawings shows in perspective a semiconductor wafer (semiconductor device) prior to being divided into individual semiconductor chips, the semiconductor wafer having integrated circuits formed thereon in a wafer processing step. As shown in FIG. 1(a), the semiconductor wafer, generated denoted at 110, has a plurality of chip regions 102 defined by scribing line regions 101.

FIG. 1(b) of the accompanying drawings shows in enlarged plan an encircled portion A of the semiconductor device shown in FIG. 1(a). Usually, circuit elements such as transistors or the like are not formed in the scribing line regions 101. The chip regions 102 surrounded by the scribing line regions 101 contain circuit elements such as transistors or the like which are formed in semiconductor layers thereof, and these circuit elements make up integrated circuits. Bonding pads 103 made of metal such as aluminum or the like are formed as terminals of integrated circuits on inner peripheral edges of the chip regions 102.

In the fabrication of semiconductor devices, the integrated circuits in the chip regions 102 on the semiconductor wafer 110 shown in FIGS. 1(a) and 1(b) are inspected for their electric characteristics when the wafer processing step is finished. The test is referred to as a wafer probe test which employs a wafer prober.

After the wafer probe test, the semiconductor wafer 110 is divided into individual chips along the scribing line regions 101. The separate individual chips are then packaged by respective enclosures. The bonding pads 103 on the chips are connected to inner leads in the enclosures by wire bonding.

A wafer probe test will be described below.

First, a probe card for electrically connecting a test head of the wafer prober and an integrated circuit is fixed to the test head. As shown in FIG. 2(a) of the accompanying drawings, the probe card is in the form of a flat disk with a central opening 121 and has a plurality of conductive probes 122 projecting into the central opening 121 and a plurality of electrode pins 123 electrically connected to the respective probes 122. The electrode pins 123 are electrically connected to the test head when the probe card is fixed to the test head. As shown in FIG. 2(b) of the accompanying drawings, the probes 122 have respective tip ends positionally adjusted in the alignment with the layout of the bonding pads 103 of a chip region 102 which is to be tested.

After the probe card has been fixed to the test head, the semiconductor wafer 110 is fastened to a stage of the wafer prober. The stage is movable in X and Y directions extending perpendicularly to each other parallel to the plane of the semiconductor wafer 110, a Z direction extending perpendicularly to the plane of the semiconductor wafer 110, and a θ direction around the Z direction. When the semiconductor wafer 110 is fastened to the stage, the wafer prober recognizes the pattern of the desired chip region 102 on the semiconductor wafer 110. After the pattern of the chip region 102 has been recognized, the wafer prober automatically adjust the angular orientation of the stage in the θ direction in order to bring the X and Y directions of the stage into alignment with the directions of the scribing lines of the semiconductor wafer 110, and also roughly positions the stage so that the desired chip region 102 will be positioned in the central opening 121 of the probe card.

Thereafter, while looking through the stereomicroscope of the wafer prober, the operator makes manual fine adjustments of the position of the stage for positionally aligning the probes 122 of the probe card with the respective bonding pads 103 of the chip region 102. Specifically, such manual fine adjustments of the position of the stage are effected by moving the stage in the Z direction to bring the probes 122 against the semiconductor wafer 110 to mark the semiconductor wafer 110 with the probes 122, moving the probes 122 away from the semiconductor wafer 110, confirming the positions of the marks of the probes 122 on the semiconductor wafer 110 with the stereomicroscope, and adjusting the stage in the X, Y, and θ directions until the positions of all the probes 122 are aligned with the corresponding bonding pads 103.

After the manual fine adjustments of the position of the stage have been finished, the wafer prober automatically inspects successively the integrated circuits on the chip regions 102 for their electric characteristics.

Efforts have been made in the art to manufacture semiconductor products with more pins and smaller bonding pad pitches or spacings. With smaller bonding pad pitches or spacings, it becomes more difficult for the operator to find boundaries between adjacent bonding pads 103 and to see marks of the probes 122 because the probes 122 themselves are closely spaced and get in the way when the operator makes manual fine adjustments of the position of the stage using the stereomicroscope. Therefore, it is more difficult to position the probes 122 with respect to the bonding pads 103 with a high degree of accuracy. As a consequence, the probes 122 tend to be in poor contact with the bonding pads 103, resulting in a greater possibility to judge acceptable semiconductor devices as defective semiconductor devices and hence in a poor yield of semiconductor devices.

Japanese patent laid-open No. 64-73629 discloses a semiconductor integrated circuit having at least two mark pads as a positioning reference in a chip region for facilitating positioning of probes with respect to bonding pads. Specifically, the disclosed semiconductor integrated circuit comprises a chip, a circuit element disposed on the chip, a plurality of pads serving as terminals for supplying electric energy to the circuit element and transmitting input and output signals to and from the circuit element, and at least two mark pads as a positioning reference on the chip for use in bringing test probes into contact with the pads, respectively. The mark pads are positioned in the same row as the bonding pads. The test probes and the bonding pads can be accurately aligned with each other when mark pad probes, separate from the test probes, are aligned with central position of the mark pads.

Since, however, the mark pads are positioned in the same row as the bonding pads, smaller pitches or spacings between the bonding pads are liable to cause the mark pads to be concealed by test probes, with the result that the mark pad probes cannot accurately be positioned with respect to the mark pads. Another problem is that the mark pads on the chip reduce the effective availability of the area of the chip.

Furthermore, the mark pads, which only serve as a positioning reference, are not effective to check whether the probes are in actual contact with the bonding pads. Therefore, the possibility to judge acceptable semiconductor devices as defective semiconductor devices still remains with the disclosed arrangement.

SUMMARY OF THE INVENTION

It is therefore an object of the present invention to provide a semiconductor device which allows bonding pads and a probe card to be positioned easily with respect to each other when integrated circuits on a semiconductor wafer are tested by a wafer prober.

To achieve the above object, there is provided in accordance with the present invention a semiconductor device comprising a plurality of chip regions each having an element disposed therein and a plurality of electrode pads disposed on a surface thereof, the chip regions being separated by scribing line regions, and a plurality of dummy pads disposed in the scribing line regions for use in positioning the electrode pads upon wafer probe test, the dummy pads being disposed in diagonally opposite positions across each of the chip regions one on each side of the each of the chip regions.

Since the dummy pads in the scribing line regions are spaced independently from the electrode pads, the dummy pads can easily be recognized to be in position by the operator even if the electrode pads are arranged at small pitches or spacings. When dummy probes of a probe card are aligned with the dummy pads, test probes of the probe card can easily and accurately be positioned in alignment with the electrode pads upon wafer probe test. Inasmuch as the dummy pads are positioned in the diagonally opposite positions across each of the chip regions one on each side of the each of the chip regions, the semiconductor device can easily be positioned angularly in the plane of the semiconductor device with high accuracy. A visual mark provided on each of the dummy pads for differentiating from the electrode pads allows the operator to position the dummy pads more easily.

The dummy pads should preferably be smaller in size than the electrode pads. Even if the tip ends of the test probes used for wafer probe test are subjected to positional variations, the test probes can reliably be aligned with the electrode pads simply when the dummy pads are aligned with the dummy probes. If the dummy pads around each of the chip regions are electrically connected to each other, then whether the dummy pads are accurately aligned with the dummy probes or not can be checked not only visually but also electrically, resulting in a reduction in errors in positioning the electrode pads with respect to the dummy pads.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1A:
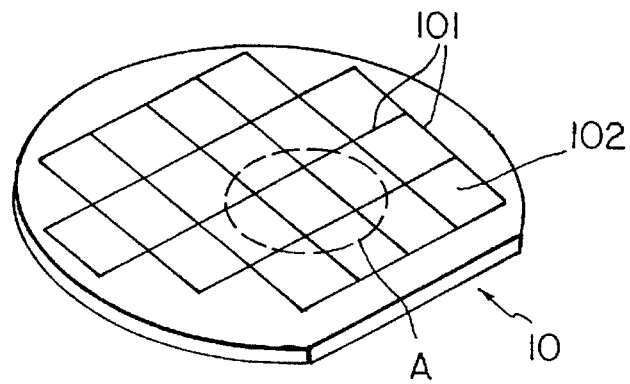
FIG. 1(a) is a perspective view of a conventional semiconductor device.
Figure 1B:
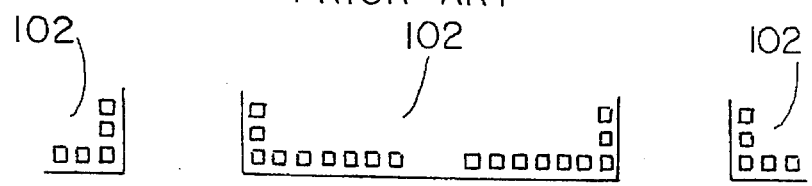
FIG. 1(b) is an enlarged fragmentary plan view of an encircled portion A of the semiconductor device shown in FIG. 1(a)
Figure 1B:
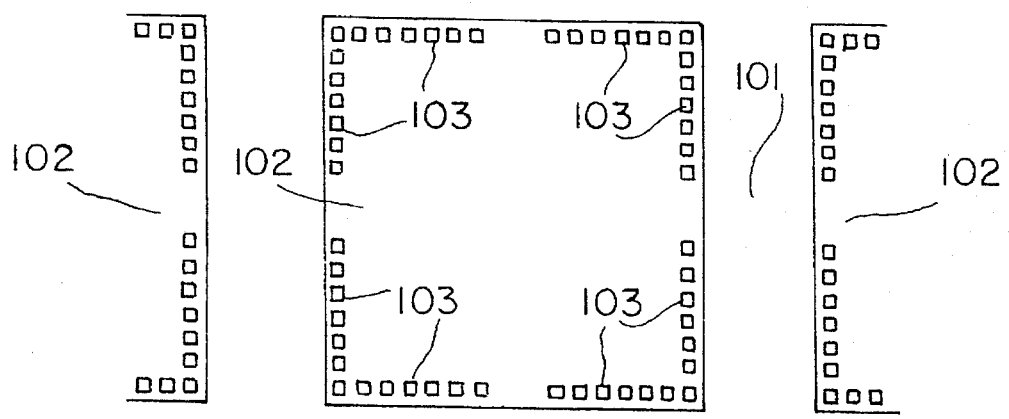
Figure 1B:
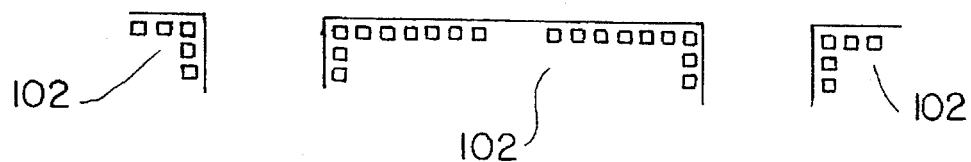
Figure 2A:
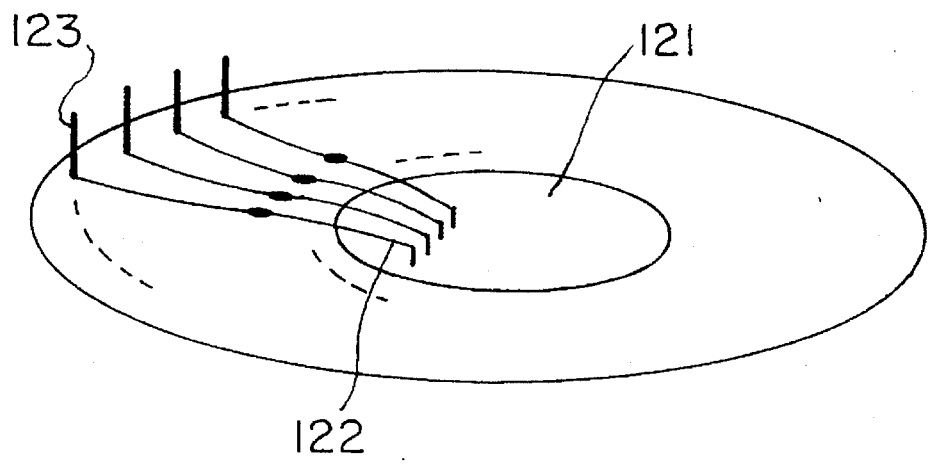
FIG. 2(a) is a perspective view of a probe card for use in wafer probe test of the conventional semiconductor device.
Figure 2B:
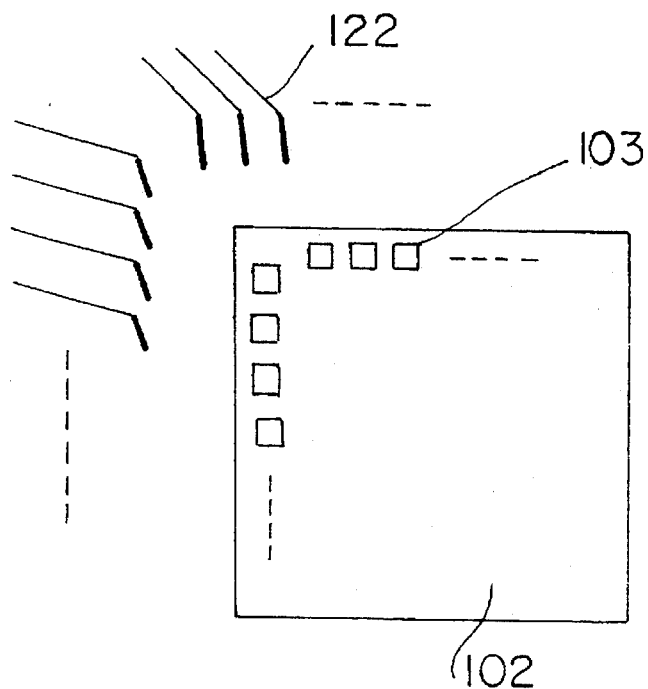
FIG. 2(b) is an enlarged fragmentary plan view of tip ends of probes of the probe card shown in FIG. 2(a) and bonding pads of the conventional semiconductor device.
Figure 3A:
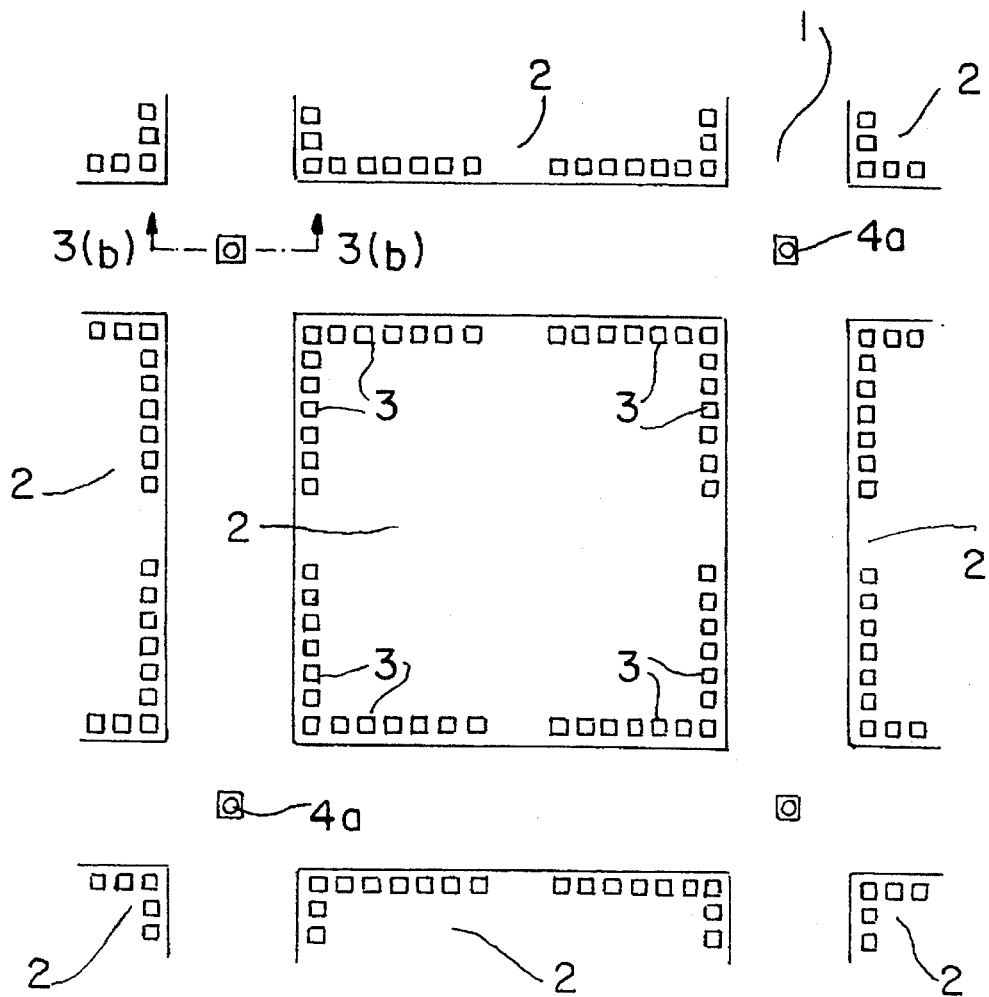
FIG. 3(a) is an enlarged fragmentary plan view of a semiconductor device according to a first embodiment of the present invention.

As shown in FIG. 3(a), a semiconductor device according to a first embodiment of the present invention, which has been processed by a wafer processing step, has a plurality of chip regions 2 separated and defined by scribing line regions 1 arranged in a grid pattern.

Each of the chip regions 2 contains a plurality of semiconductor devices fabricated in a semiconductor substrate which jointly make up an integrated circuit. The integrated circuit is supplied with electric energy from a power supply and input and output signals are transmitted through a plurality of bonding pads 3 disposed on peripheral edges of the chip region 2. The chip regions 2 themselves are identical to those of the conventional semiconductor devices.

Figure 3B:
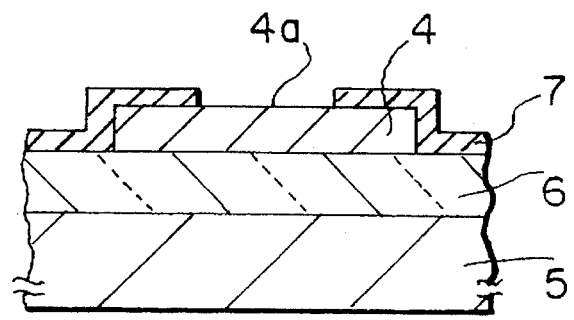
FIG. 3(b) is a cross-sectional view taken along line 3(b)—3(b) of FIG. 3(a)

According to the first embodiment, a plurality of dummy pads 4a for positional adjustment of probes upon wafer probe test are disposed substantially centrally in the respective intersections of the scribing line regions 1. As shown in FIG. 3(b), each of the dummy pads 4a comprises an aluminum film 4 deposited on an insulating layer 6 disposed on a silicon substrate 5, and a protective cover film 7 disposed on the aluminum film 4, the protective cover film 7 being partly removed in an area of given size where the aluminum film 4 is exposed. The removed area of the protective cover film 7 where the aluminum film 4 is exposed is of a shape different from the shape of the bonding pads 3 to give the operator a visual mark for positional adjustment of probes 22 (see FIG. 4) as described later on. In the first embodiment, the removed area of the protective cover film 7 is of a circular shape.

Figure 4:
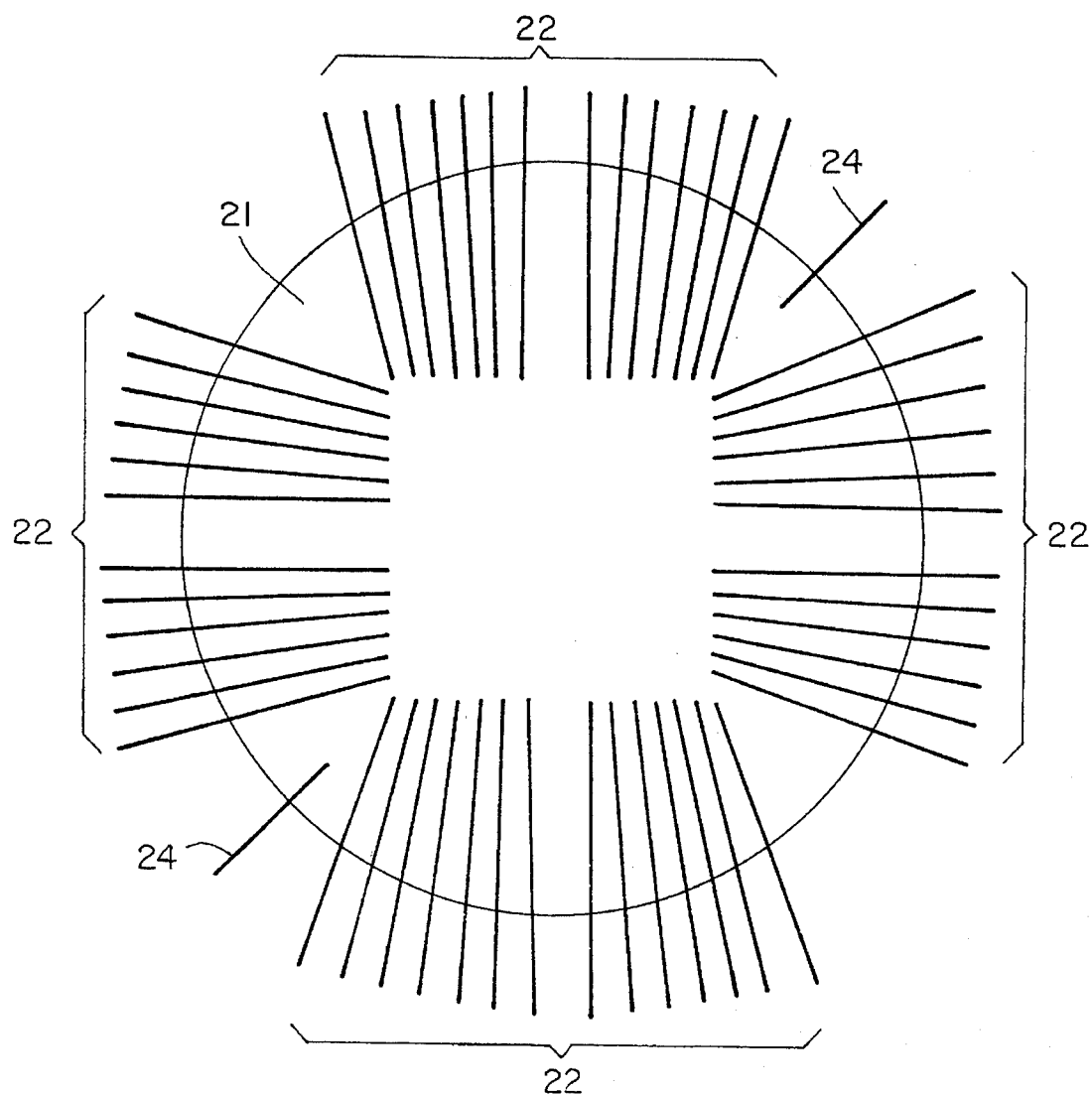
FIG. 4 is an enlarged fragmentary plan view of a probe card for use in wafer probe test of the semiconductor device shown in FIGS. 3(a) and 3(b), the view showing the probe card in the vicinity of a central opening thereof.

As shown in FIG. 4, a probe card for use in wafer probe test of the semiconductor device shown in FIGS. 3(a) and 3(b) has a plurality of probes 22 corresponding to the respective bonding pads 3 and two dummy probes 24 corresponding to respective two of the dummy pads 4a which are positioned on diagonal lines across the chip region 2. The probes 22 and the dummy probes 24 have respective tip ends positionally adjusted in alignment with the layout of the bonding pads 3 and the dummy pads 4a and projecting into a central circular opening 21 defined in the probe card.

Figure 5:
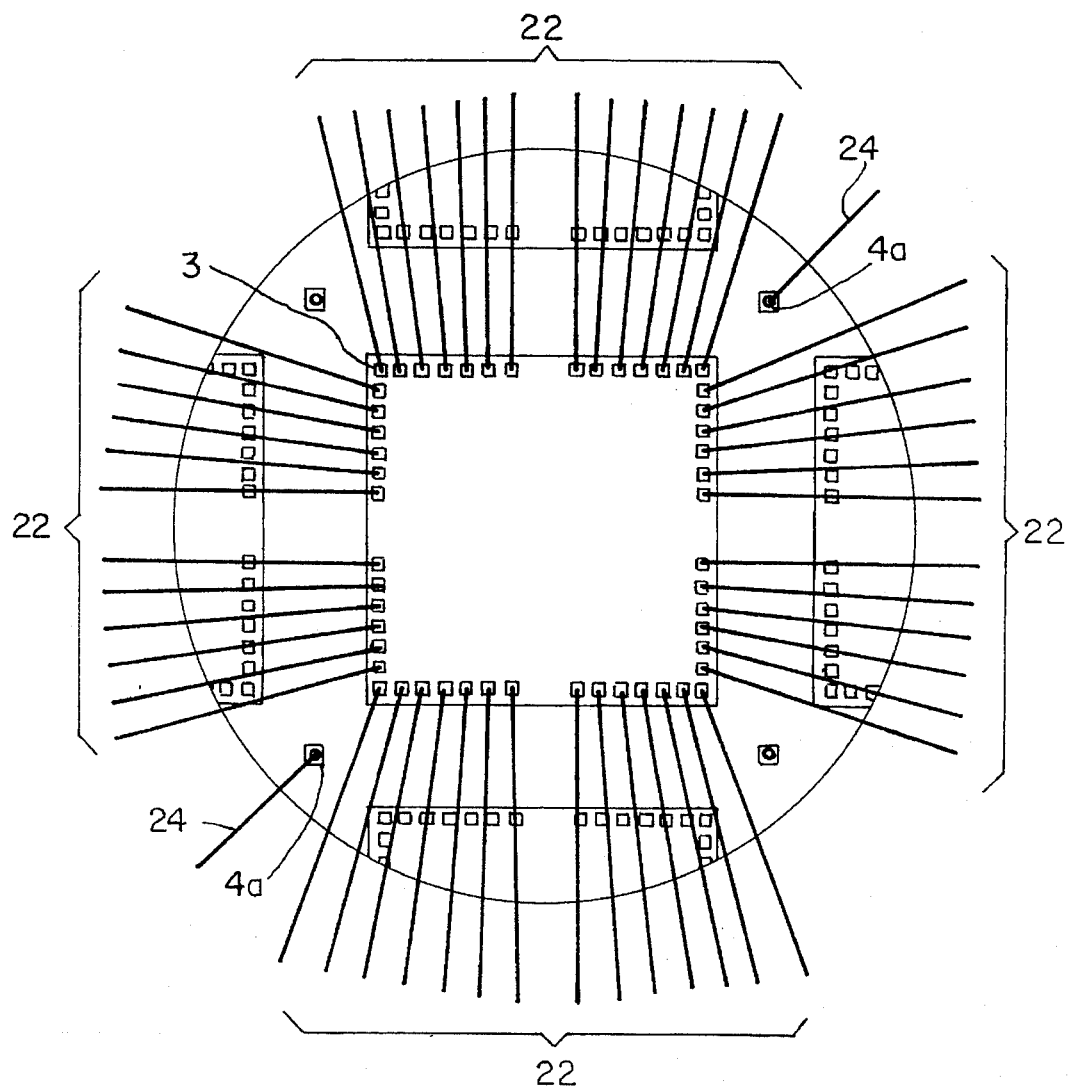
FIG. 5 is an enlarged fragmentary plan view illustrating the manner in which the semiconductor device shown in FIGS. 3(a) and 3(b) is positioned using the probe card shown in FIG. 4.

In a wafer probe test of the semiconductor device according to the first embodiment using the probe card, the dummy probes 24 and the dummy pads 4a, rather than the probes 22 and the bonding pads 3, are aligned with each other to position the semiconductor device with respect to the probe card. The dummy probes 24 and the dummy pads 4a are positioned with respect to each other by making fine adjustments of a stage to which the semiconductor device is fastened, in X, Y, and θ directions using a stereomicroscope. Since the tip ends of the probes 22 and the dummy probes 24 are positionally adjusted as described above, the probes 22 can be positioned in alignment with the respective bonding pads 3 when the dummy probes 24 and the dummy pads 4a are aligned with respect to each other as shown in FIG. 5.

While the bonding pads 3 are closely spaced at small intervals, the dummy pads 4a are spaced from and positioned independently of the bonding pads 3, with nothing inconveniently positioned around the dummy pads 4a. As a consequence, the operator can easily see marks of the dummy probes 24 on the dummy pads 4a, and hence can easily position the dummy probes 24 with respect to the dummy pads 4a. Since the dummy probes 24 and the dummy pads 4a are positioned with respect to each other on diagonal lines across the chip region 2, the stage can be adjusted highly accurately in the θ direction.

Though the tip ends of the probes 22 and the dummy probes 24 are positionally adjusted in alignment with the layout of the bonding pads 3 and the dummy pads 4, the relative positions of the tip ends of the probes 22 and the dummy probes 24 tend to have accuracy variations. Depending on such accuracy variations of the relative positions of the tip ends of the probes 22 and the dummy probes 24, the dummy pads 4a, i.e., the areas of the dummy pads 4a where the aluminum film 4 is exposed, should preferably be of a size smaller than the bonding pads 3. This allows the probes 22 to be positioned reliably on the respective bonding pads 3.

Specifically, the accuracy of the relative positions of the tip ends of the probes 22 and the dummy probes 24 suffer variations of about 10 μm according to the present probe card fabrication technology. Therefore, the size of the areas of the dummy pads 4a where the aluminum film 4 is exposed is made smaller than the size of the bonding pads 3 by about 20 μm. With the dummy pads 4a being of such a size, the probes 22 can be positioned reliably on the respective bonding pads 3 even if the relative positions of the tip ends of the probes 22 and the dummy probes 24 are subject to accuracy variations. In the first embodiment, each of the bonding pads 3 is 100 μm long on each side, and each of the areas of the dummy pads 4a where the aluminum film 4 is exposed is 80 μm across.

Figures 6A, 6B:
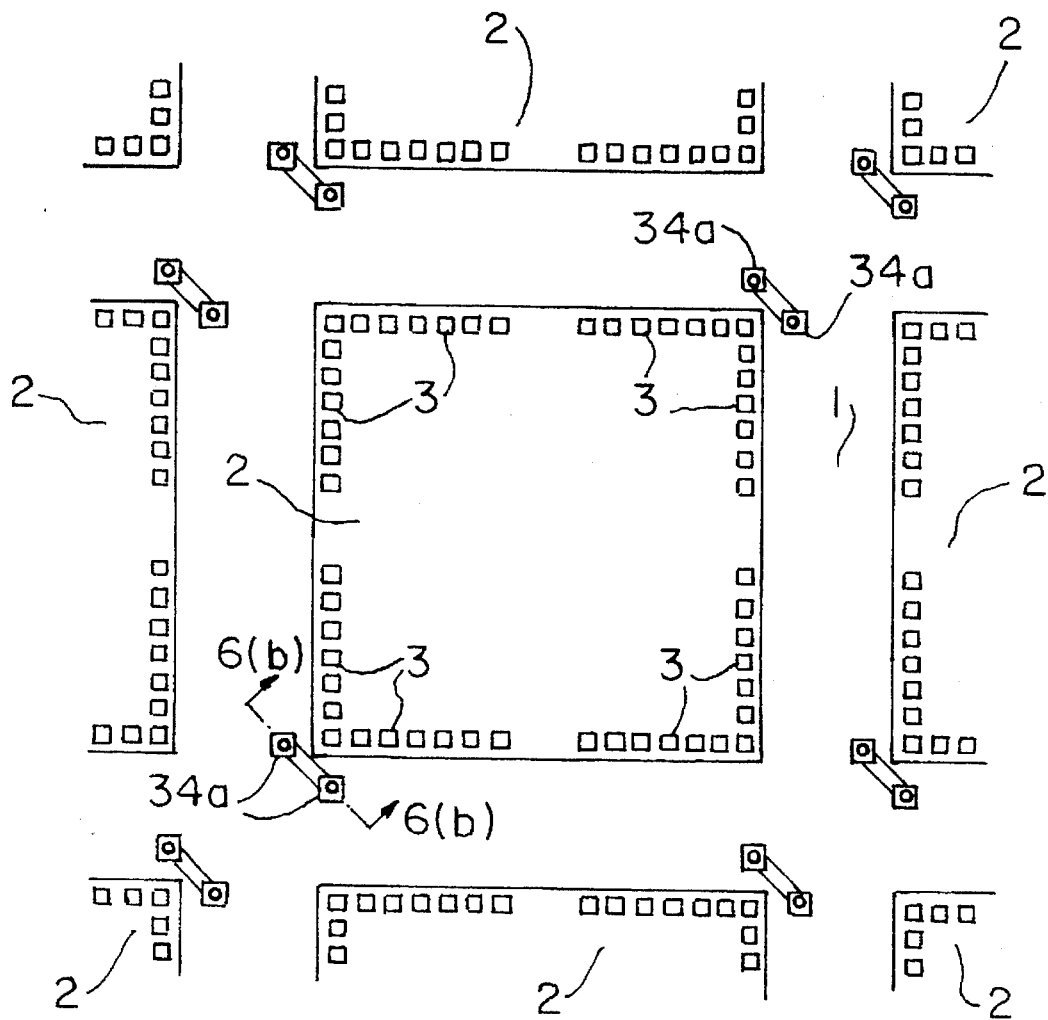
FIG. 6(a) is an enlarged fragmentary plan view of a semiconductor device according to a second embodiment of the present invention.
FIG. 6(b) is a cross-sectional view taken along line 6(b)—6(b) of FIG. 6(a)

FIGS. 6(a) and 6(b) show a semiconductor device according to a second embodiment of the present invention. Those parts shown in FIGS. 6(a) and 6(b) which are identical to those shown in FIGS. 3(a) and 3(b) are denoted by identical reference numerals, and will not be described in detail below.

In the second embodiment, as shown in FIG. 6(a), two dummy pads 34a are disposed in the scribing line regions 1 at each of two diagonally opposite positions on a diagonal line across each of the chip regions 2.

In each of the diagonally opposite positions, the dummy pads 34a are electrically connected to each other by a wire 34b extending therebetween. The wire 34b is composed of the aluminum film 4. The two electrically connected dummy pads 34a are produced by removing two portions from the protective cover film 7 as shown in FIG. 6(b). The size and shape of each of the dummy pads 34a are the same as those of the dummy pads 4a according to the first embodiment.

A probe card for use in wafer probe test of the semiconductor device shown in FIGS. 6(a) and 6(b) has a plurality of probes corresponding to the respective bonding pads 3 and two dummy probes 24 corresponding to the respective two dummy pads 34a in each of the two diagonally opposite positions across the chip region 2 one on each side of the chip region 2. The probes and the dummy probes have respective tip ends positionally adjusted in alignment with the layout of the bonding pads 3 and the dummy pads 34a.

In wafer probe test of the semiconductor device according to the second embodiment using the probe card, the dummy probes of the probe card are aligned with the respective dummy pads 34a for thereby positioning the semiconductor device. Whether the dummy pads 34a and the dummy probes are in contact with each other or not is electrically checked based on electric conduction between the dummy probes in each of the diagonally opposite positions. If the dummy pads 34a are in contact with the dummy probes any of the diagonally opposite positions, then electric conduction is present between the dummy probes paired in that position, indicating that the dummy probes and the dummy pads 34a are properly positioned with respect to each other.

Since the two dummy probes 34a in each of the diagonally opposite positions are electrically connected to each other in the second embodiment, the semiconductor device according to the second embodiment offers the same advantages as those of the first embodiment, and also makes it possible to electrically confirm whether or not the semiconductor device is properly positioned upon wafer probe test. Consequently, the semiconductor device can be positioned more accurately, resulting in a greater reduction in misjudgments as to the quality of semiconductor devices due to positioning errors.

Figure 7:
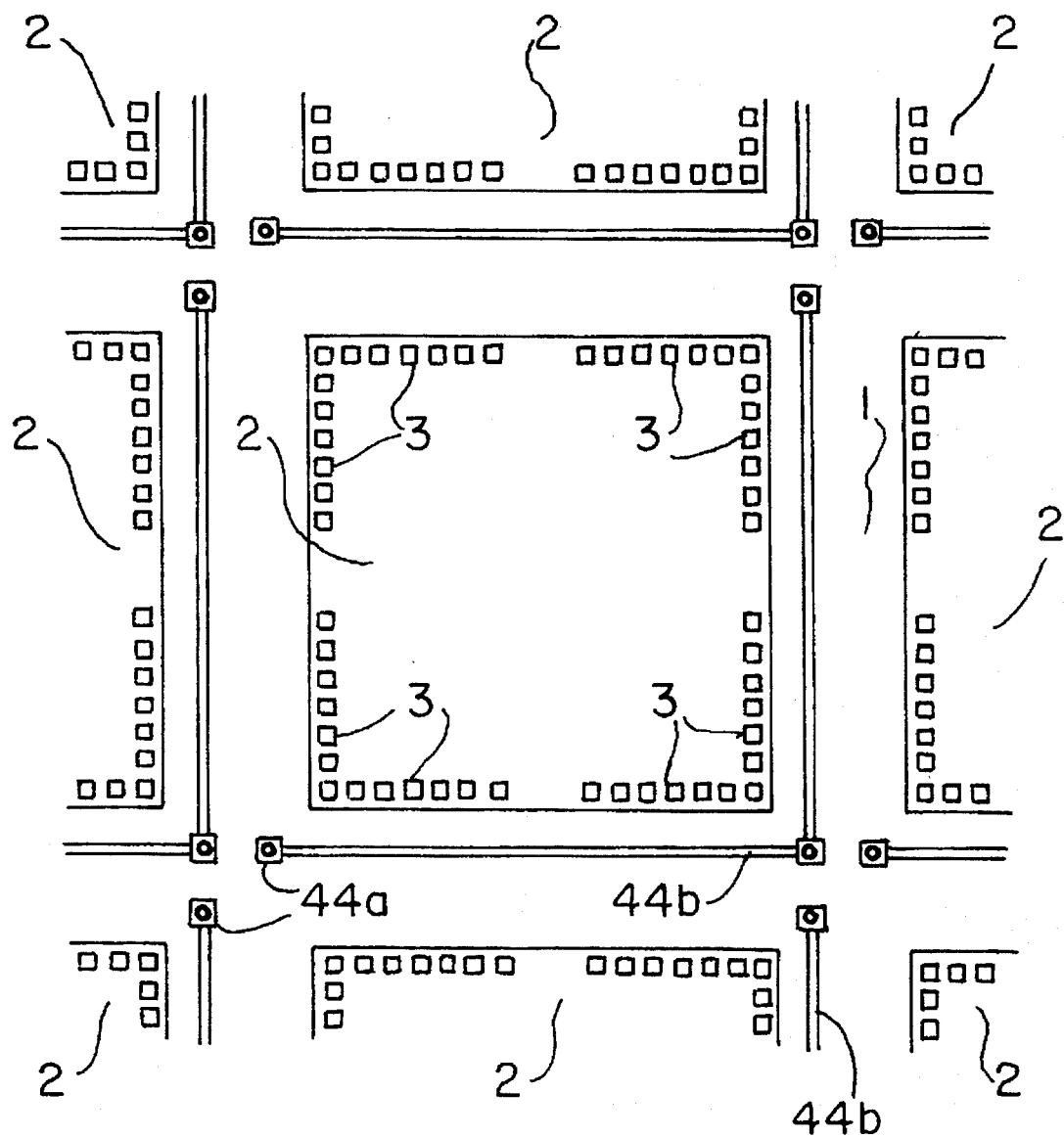
FIG. 7 is an enlarged fragmentary plan view of a semiconductor device according to a third embodiment of the present invention.

FIG. 7 shows a semiconductor device according to a third embodiment of the present invention. Those parts shown in FIG. 7 which are identical to those shown in FIGS. 3(a) and 3(b) are denoted by identical reference numerals, and will not be described in detail below.

In the third embodiment, as shown in FIG. 7, three dummy pads 44a are disposed in the scribing line regions 1 at respective three corners of each of the chip regions 2. The three dummy pads 44a are electrically connected to each other by wires 44b extending therebetween. A probe card for use in wafer probe test of the semiconductor device shown in FIG. 7 has a plurality of probes corresponding to the respective bonding pads 3 and three dummy probes corresponding to the respective three dummy pads 44a.

In wafer probe test of the semiconductor device according to the third embodiment using the probe card, the dummy probes of the probe card are aligned with the respective dummy pads 44a for thereby positioning the semiconductor device. Whether the dummy pads 44a and the dummy probes are in contact with each other or not is electrically checked based on electric conduction between the three dummy probes. If the dummy pads 44a are in contact with the dummy probes, then electric conduction is present between all the dummy probes, indicating that the dummy probes and the dummy pads 44a are properly positioned with respect to each other.

While each of the dummy pads 4a, 34a, 44a according to the above embodiments is produced by removing a circular pattern from the protective cover film 7, it may be produced by removing a hair-cross-line pattern from the protective cover film 7. Alternatively, each of the dummy pads 4a, 34a, 44a may be in the form of an appropriate mark applied to the aluminum film 4 itself. The principles of the present invention are applicable not only to a semiconductor device having bonding pads 3 as electrode pads, but also to a semiconductor device having bump electrodes.

With the arrangement of the present invention, as described above, since a plurality of dummy pads are disposed in scribing line regions at diagonally opposite positions across each of chip regions, electrode pads can easily and accurately be aligned with respective bonding pads during the wafer probe test when dummy probes are aligned with the dummy pads even if the bonding pads are arranged at small pitches or spacings.

With the dummy pads having a size smaller than the size of the electrode pads, probes of a probe card used for wafer probe test can reliably be positioned in alignment with the electrode pads even if the tip ends of the probes are subjected to positional variations. In the case where the dummy pads around each chip region are electrically connected to each other, whether the dummy pads are accurately aligned with respect to the dummy probes can be electrically checked, resulting in reduced positioning errors. A visual mark provided for differentiating the dummy pads from the electrode pads allows the operator to position the dummy pads more easily.

Although certain preferred embodiments of the present invention have been shown and described in detail, it should be understood that various changes and modifications may be made therein without departing from the scope of the appended claims.

What is claimed is:

1. A semiconductor device comprising a plurality of chip regions each having semiconductor elements disposed therein and a plurality of electrode pads disposed on a surface thereof, said chip regions being separated by scribing line regions, and a plurality of dummy pads disposed in said scribing line regions for use in positioning said electrode pads during a wafer probe test, said dummy pads being smaller in size than said electrode pads and disposed in diagonally opposite positions across each of said chip regions one on each side of said each of the chip regions.

2. A semiconductor device according to claim 1, wherein said dummy pads include a plurality of dummy pads disposed in each of said diagonally opposite positions and electrically connected to each other.

3. A semiconductor device according to claim 1, wherein said plurality of dummy pads are electrically connected to each other.

4. A semiconductor device according to claim 1, wherein each of said dummy pads has a visual mark for differentiating from said electrode pads.

5. A semiconductor device according to claim 2, wherein each of said dummy pads has a visual mark for differentiating from said electrode pads.

6. A semiconductor device according to claim 3, wherein each of said dummy pads has a visual mark for differentiating from said electrode pads.

* * * * *

UNITED STATES PATENT AND TRADEMARK OFFICE
CERTIFICATE OF CORRECTION

PATENT NO. : 5,616,931
DATED : April 1, 1997
INVENTOR(S) : Toru NAKAMURA, et al.

It is certified that error appears in the above-indentified patent and that said Letters Patent is hereby corrected as shown below:

On the title page, item [54] delete the title and insert the following:

-- SEMICONDUCTOR DEVICE HAVING ELECTRODE AND DUMMY PADS FOR FACILITATING THE TESTING OF SEMICONDUCTOR ELEMENTS INCLUDED THEREIN--.

Signed and Sealed this

Fourteenth Day of October, 1997

Attest:

BRUCE LEHMAN

Attesting Officer

Commissioner of Patents and Trademarks